(12) United States Patent
Chen et al.

(10) Patent No.: US 11,817,389 B2
(45) Date of Patent: Nov. 14, 2023

(54) MULTI-METAL INTERCONNECTS FOR SEMICONDUCTOR DEVICE STRUCTURES

(71) Applicant: International Business Machines Corporation, Armonk, NY (US)

(72) Inventors: Hsueh-Chung Chen, Cohoes, NY (US); Chih-Chao Yang, Glenmont, NY (US); Yann Mignot, Slingerlands, NY (US); Shanti Pancharatnam, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/828,288

(22) Filed: Mar. 24, 2020

(65) Prior Publication Data

US 2021/0305160 A1    Sep. 30, 2021

(51) Int. Cl.
| | |
|---|---|
| *H01L 23/535* | (2006.01) |
| *H01L 23/532* | (2006.01) |
| *H10B 61/00* | (2023.01) |
| *H10B 63/00* | (2023.01) |
| *H10N 50/10* | (2023.01) |
| *H10N 70/00* | (2023.01) |
| *H10N 70/20* | (2023.01) |

(Continued)

(52) U.S. Cl.
CPC ...... *H01L 23/535* (2013.01); *H01L 21/76805* (2013.01); *H01L 21/76895* (2013.01); *H01L 23/53209* (2013.01); *H01L 23/53228* (2013.01); *H01L 23/53242* (2013.01); *H10B 61/00* (2023.02); *H10B 63/80* (2023.02); *H10N 50/01* (2023.02); *H10N 50/10* (2023.02); *H10N 70/011* (2023.02); *H10N 70/231* (2023.02)

(58) Field of Classification Search
CPC . H01L 23/535; H01L 45/06; H01L 23/53209; H01L 21/76805; H01L 27/2463; H01L 43/12; H01L 45/16; H01L 21/76895; H01L 23/53228; H01L 43/08; H01L 23/53242; H01L 27/222; H01L 21/76877; H10B 61/00; H10B 63/80; H10N 50/01; H10N 50/10; H10N 70/011; H10N 70/231
USPC .......................................................... 257/5
See application file for complete search history.

(56) References Cited

U.S. PATENT DOCUMENTS

| | | |
|---|---|---|
| 6,455,415 B1 | 9/2002 | Lopatin et al. |
| 6,887,781 B2 | 5/2005 | Lee et al. |
| 7,429,402 B2 | 9/2008 | Gandikota et al. |

(Continued)

FOREIGN PATENT DOCUMENTS

KR    20040039593    11/2002

*Primary Examiner* — Duy T Nguyen
(74) *Attorney, Agent, or Firm* — Fleit Intellectual Property Law; Thomas Grzesik

(57) ABSTRACT

A semiconductor device structure includes a memory element disposed within an interlayer dielectric (ILD) layer. A contact is disposed within the ILD in contact with the memory element and includes a first metal. A logic element is disposed within the ILD and comprises a second metal that is different than the first metal. A method of forming the semiconductor structure includes forming at least one memory element within an interlayer dielectric (ILD) layer. A contact that includes a first metal is formed in contact with the memory element. At least one logic element is formed in the ILD layer, where the logic element includes a second metal that is different than the first metal.

18 Claims, 13 Drawing Sheets

(51) Int. Cl.
*H01L 21/768* (2006.01)
*H10N 50/01* (2023.01)

(56) References Cited

U.S. PATENT DOCUMENTS

| | | |
|---|---|---|
| 7,838,413 B2 | 11/2010 | Lee |
| 8,435,887 B2 | 5/2013 | Kelly et al. |
| 8,461,684 B2 | 6/2013 | Gordon et al. |
| 9,299,643 B2 | 3/2016 | Wang et al. |
| 9,761,526 B2 | 9/2017 | Stamper et al. |
| 9,837,350 B2 | 12/2017 | Briggs et al. |
| 10,347,528 B1 | 7/2019 | Singh et al. |
| 2006/0097397 A1 | 5/2006 | Russell |
| 2010/0078815 A1 | 4/2010 | Wang et al. |
| 2015/0311253 A1* | 10/2015 | Choi ................. H01L 43/08 257/252 |
| 2016/0181520 A1* | 6/2016 | Park ................. G06F 12/0802 257/4 |
| 2017/0018506 A1 | 1/2017 | Cao et al. |
| 2017/0084820 A1* | 3/2017 | Tan ................. H01L 43/12 |
| 2017/0221831 A1 | 8/2017 | Stamper et al. |
| 2018/0096888 A1 | 4/2018 | Naik et al. |
| 2018/0277517 A1* | 9/2018 | Kim ................. H01L 25/50 |
| 2019/0157145 A1 | 5/2019 | Ren et al. |
| 2019/0164781 A1 | 5/2019 | Tien et al. |
| 2021/0083174 A1* | 3/2021 | Aggarwal ............. H10B 61/00 |
| 2021/0091303 A1* | 3/2021 | Patlolla ................. H10N 50/85 |

\* cited by examiner

MULTI-METAL INTERCONNECTS FOR SEMICONDUCTOR DEVICE STRUCTURES

BACKGROUND OF THE INVENTION

The present invention generally relates to the field of semiconductors, and more particularly relates to fabricating interconnects for semiconductor device structures.

Semiconductor devices such as memory devices are often integrated with various other logic gates and electronic components such as transistors, capacitors, and/or the like. These components are coupled to each other utilizing various levels of interconnects and metal wires. When memory area interconnect levels need to be insulated from heat generated by the underlying memory devices a metal such as tungsten is generally utilized for the memory area metal levels such as electrode contacts. In many instances, logic area interconnects are fabricated at the same time as the memory area metal levels with the same metal. However, a tungsten line/via (or other chemical vapor deposited metal line/via) in the general logic area of the device typically results in high wire resistance, degraded device performance, decreased overall yield, and landing issues for subsequently formed via structures.

SUMMARY OF THE INVENTION

In one embodiment, a semiconductor device structure comprises a memory element disposed within an interlayer dielectric (ILD) layer. A contact is disposed within the ILD in contact with the memory element and comprises a first metal. A logic element is disposed within the ILD and comprises a second metal that is different than the first metal.

In another embodiment, a semiconductor device structure comprises a memory element disposed within an interlayer dielectric (ILD) layer. A contact is disposed within the ILD and comprises a first metal in contact with the memory element. The contact further comprises a second metal disposed above and in contact with the first metal. A logic element is disposed within the ILD and comprises the first metal and the second metal. The second metal is disposed above and in contact with the first metal.

In a further embodiment, a method of forming a semiconductor device structure comprises forming at least one memory element within an interlayer dielectric (ILD) layer. A contact comprising a first metal is formed in contact with the memory element. At least one logic element is formed in the ILD layer comprising a second metal that is different than the first metal.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
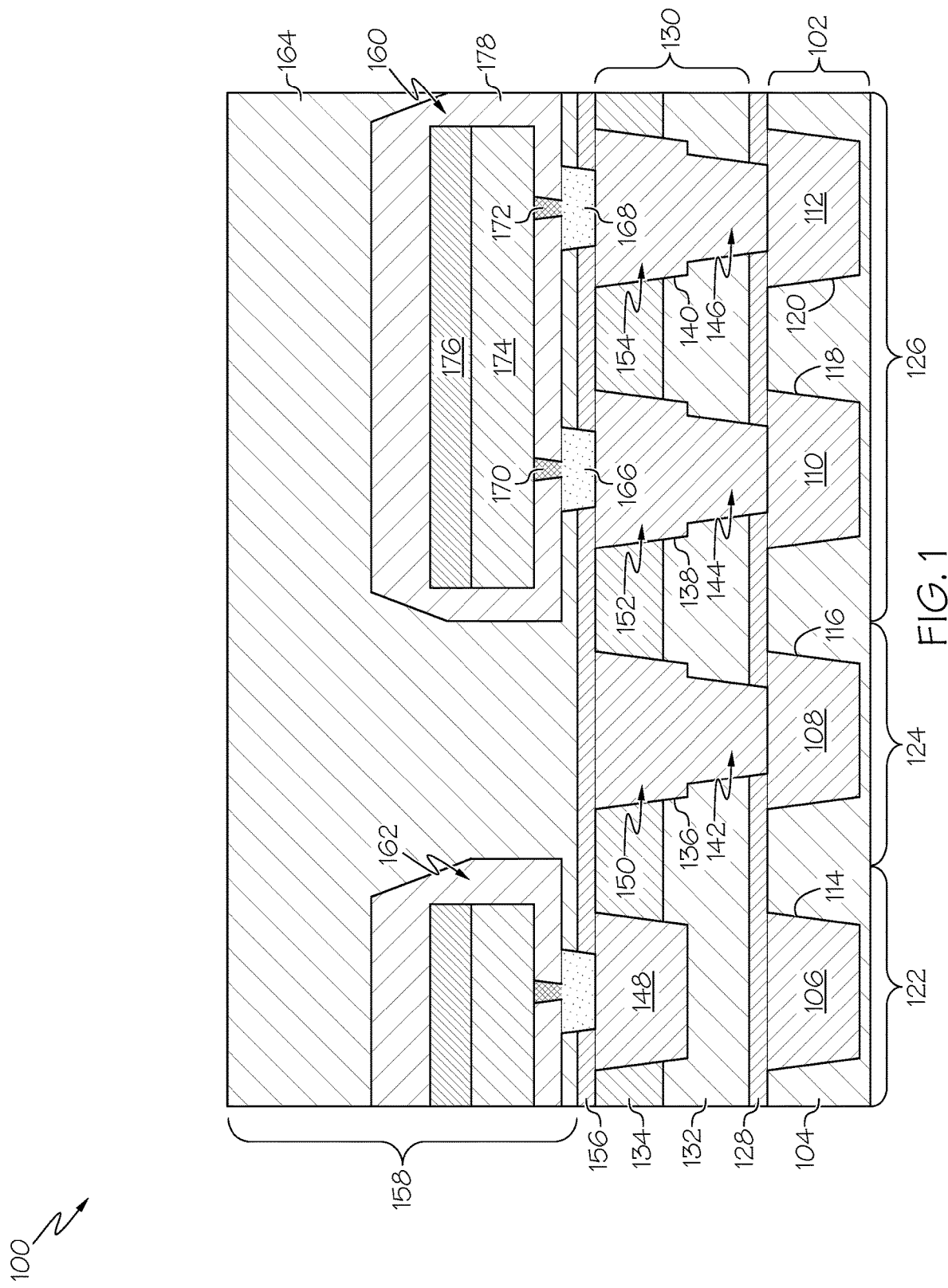
FIG. 1 is a cross-sectional view of a semiconductor device structure after metallization stacks, and one or more memory devices/elements have been formed according to one embodiment of the present invention.

It is to be understood that embodiments of the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal may be any process that removes material from the wafer; examples include etch processes (either wet or dry) and chemical-mechanical planarization (CMP).

Patterning refers to the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed by plasma ashing.

FIGS. 1-11 illustrate various processes for fabricating interconnects for semiconductor device structures comprising memory devices/elements according to one or more embodiments of the present invention. It should be noted that embodiments of the present invention are not limited to the number of layers, features, memory devices and types, etc. shown in the figures. Embodiments are applicable to any structure where metals such as tungsten are utilized to form metal layers and the method of deposition such as CVD results in a seam being formed in the metal layer. The seam causes issues such as high wire resistance and landing issues for subsequently formed via structures.

Referring now to FIG. 1, a semiconductor structure 100 is illustrated at point in time of the fabrication process after metallization layers and one or more memory devices/elements have been formed. In this example, the structure 100 comprises a first metallization material stack 102 that includes one or more layers. A first layer 104 of the stack 102 may be disposed directly on a semiconductor stack. Alternatively, in one embodiment, the first layer 104 of the stack 102 is disposed on one or more underlying layers. The first layer 104, in one embodiment, may be an interlayer dielectric (ILD) layer comprising an insulating material such as tetraethyl orthosilicate (TEOS), an oxide; a moderate-k, low-k, or ultra-low-k dielectric; and/or the like.

The first layer 104 of the stack 102 (in this example) may be referred to as the "Mx layer 104" and, in one embodiment, comprises patterned Mx metal layers/wires 106 to 112 embedded therein. If the Mx layer 104 comprises multiple layers then the patterned Mx metal layers 106 to 112 may be embedded in two or more of those layers. The one or more patterned Mx metal layers 106 to 112 may be a middle-of-line contact and may comprise tungsten, copper, cobalt, ruthenium, and/or the like. The trenches comprising the Mx metal layers 106 to 112, in one embodiment, may comprise a diffusion barrier 114 to 120 such as cobalt, tungsten, tungsten nitride, tantalum nitride, titanium nitride, aluminum, and/or the like. In the example shown in FIG. 1, a first set of patterned Mx metal layers 106 are disposed within a peripheral/dummy area 122 of the structure 100; a second set of patterned Mx metal layer 108 are disposed within a logic area 124 of the structure 100; a third set of Mx patterned metal layers 110, 112 are be disposed within a memory area 126 of the structure 100.

In the example shown in FIG. 1, one or more cap layers 128 are disposed on top of the first metallization stack 102.

The cap layer 128 may comprise a dielectric material such as silicon carbonitride (SiCN:H), silicon carbide, hydrogen and nitrogen doped silicon carbide, silicon nitride, and/or the like. A second metallization stack 130 is formed on top of the first metallization stack 102 and cap layer 128. The second metallization stack 130, in one embodiment, comprises one or more ILD layers such as a first insulating layer 132 disposed on and in contact with the cap layer 128 and a second insulating layer 134 disposed on and in contact with the first insulating layer 132. It should be noted that one or more additional layers may be formed below the first insulating layer 132; between the first and second insulating layers 132, 134; and/or above the second insulating layers 134. The first insulating layer 132 may comprise an insulating material such as tetraethyl orthosilicate (TEOS), an oxide; a moderate-k, low-k, or ultra-low-k dielectric; and/or the like. The second insulating layer 134 may comprise an insulating material such as fluorine-doped tetraethyl orthosilicate (FTEOS), an oxide; a moderate-k, low-k, or ultra-low-k dielectric; and/or the like.

In the example shown in FIG. 1, interconnect structures 136 to 140 are disposed within the second metallization stack 130. For example, FIG. 1 shows that a first set of interconnect structures 136 are disposed within a portion of second metallization stack 130 in the logic area 124 on and in contact with the underlying set of patterned Mx metal layers 108. A second set of interconnect structures 138, 140 are disposed within a portion of second metallization stack 130 in the memory area 126 on and in contact with the underlying set of patterned Mx metal layers 110, 112. The interconnect structures 136 to 140 each comprise a Vx metal layer 142 to 146 and an Mx+1 metal layer/wire 150 to 154 formed on top of and in contact with one of the Vx metal layers/vias 142 to 146. The peripheral area 122 may also have a Vx metal layer 148 disposed therein as well. The interconnect structures 136 to 140 may comprise tungsten, copper, cobalt, ruthenium, and/or the like. The Mx+1 metal layers 152, 154 within the memory area 126 may be referred to as "bottom electrode contacts 152, 154". The trenches comprising the interconnect structures 136 to 140 may each include a diffusion barrier similar to the Mx diffusion barriers 114 to 120 discussed above.

One or more cap layers 156 are disposed on top of the second metallization stack 130. The cap layer 156 may comprise a dielectric material(s) such as silicon carbonitride (SiCN:H), silicon carbide, hydrogen and nitrogen doped silicon carbide, silicon nitride, and/or the like. A device layer(s) 158 comprising one or more memory devices/elements 160, 162 and insulating layers 164 is formed above the second metallization stack 130. The insulating layer 164 may be an ILD layer comprising an insulating material such as tetraethyl orthosilicate (TEOS), an oxide; a moderate-k, low-k, or ultra-low-k dielectric; and/or the like.

In the example shown in FIG. 1, the memory devices 160, 162 are phase change memory (PCM) devices and are disposed within the memory area 126 of the structure 100. However, embodiments of the present invention are not limited to PCM devices and are applicable to any memory device types (e.g., magneto-resistive memory devices) where metals such as tungsten (or similar) metal levels are utilized to and the method of deposition results in a seam being formed in the metal layer.

In the current example, the PCM devices 160, 162 comprise one or more bottom electrodes 166, 168; one or more heater structures 170, 172; a phase change material layer 174; a top electrode 176; and a hard mask 178. The one or more bottom electrodes 166, 168 may comprise a barrier/diffusion liner and are disposed in contact with a top surface of the bottom electrode contacts 152, 154. In one embodiment, the bottom electrodes 166, 168 comprise tungsten, copper, cobalt, ruthenium, tantalum nitride, titanium nitride, aluminum, and/or the like. The one or more heater structures 170, 172 are disposed on and in contact with a top surface of the bottom electrode contacts 152, 154. The heater structures 170, 172 may comprise electrically conductive material which is chemically inert when in contact with the materials used for the phase change material layer 174 and bottom (or top) electrodes 166, 168. Examples of such electrically conductive but chemically inert materials include carbon, titanium nitride, tantalum nitride, and/or the like.

The phase change material layer 174 is disposed on and in contact with a top surface of the heater structures 170, 172. Alternatively, if the phase change material layer 174 may be disposed on and in contact with the bottom electrodes 166, 168 if the heater structures 170, 172 are disposed on a top surface of the phase change material layer 174. An optional thin metal layer may be disposed between the contact surfaces of the bottom electrodes 166, 168 and the phase change material layer 174. Examples of phase change materials include, but are not limited to, germanium-antimony-tellurium (GeSbTe), germanium-indium-antimony-tellurium (GIST), silver-indium-antimony-tellurium (AIST), and/or the like. The top electrode 176, in one embodiment, is disposed in contact with a top surface of the phase change material layer 174 The hard mask 178 surrounds the PCM device 160, 162 and may comprise, silicon oxide, silicon oxynitride, silicon carbide, silicon oxycarbide, silicon nitride, and/or the like. The hard mask 178 may include additional layers such as a silicon oxide layer formed on its sidewalls.

Figure 2:
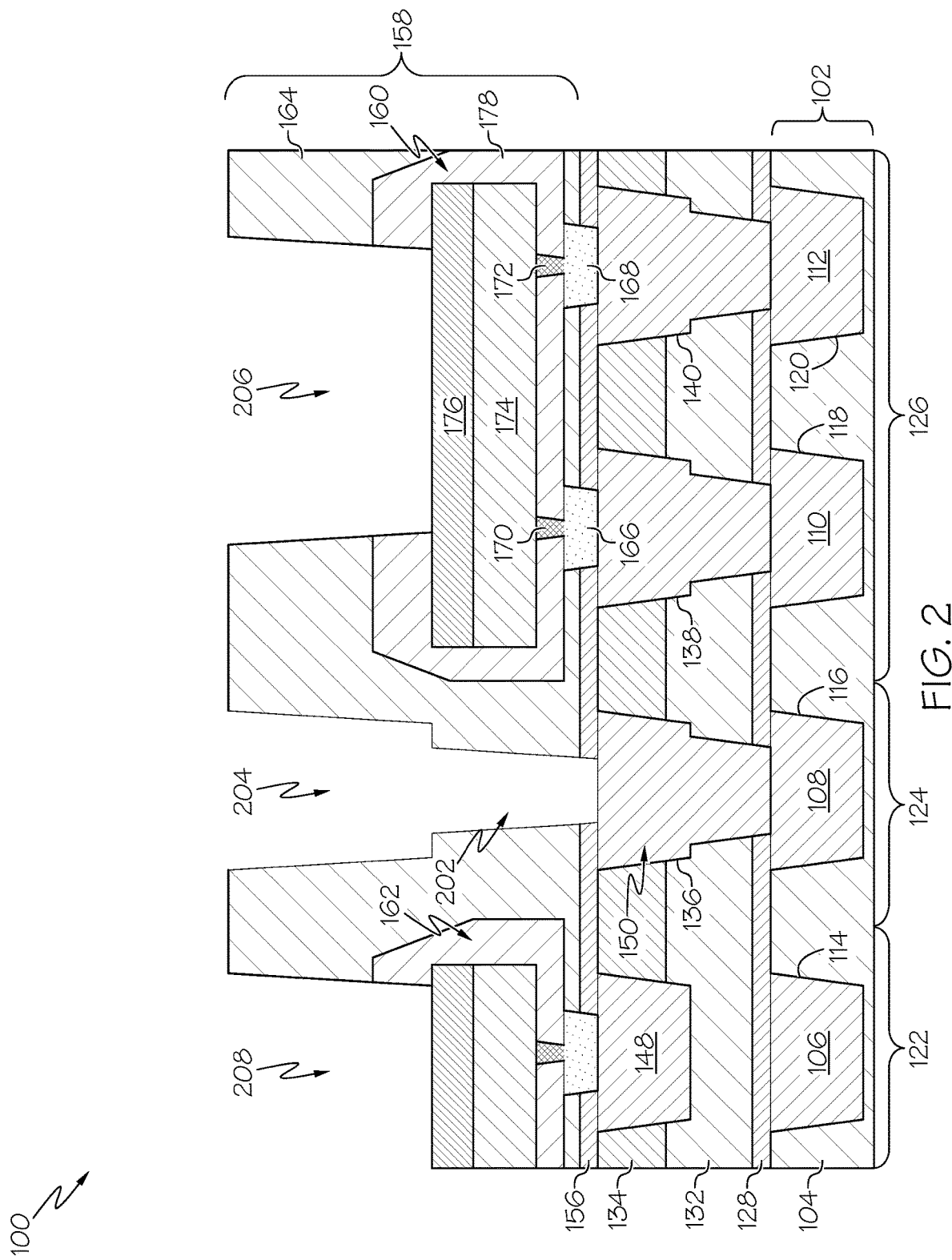
FIG. 2 is a cross-sectional view of the semiconductor device structure after patterning has been performed to form an interconnect cavity in the logic area of the structure and an electrode contact cavity in the memory device area according to one embodiment of the present invention.
Figure 3:
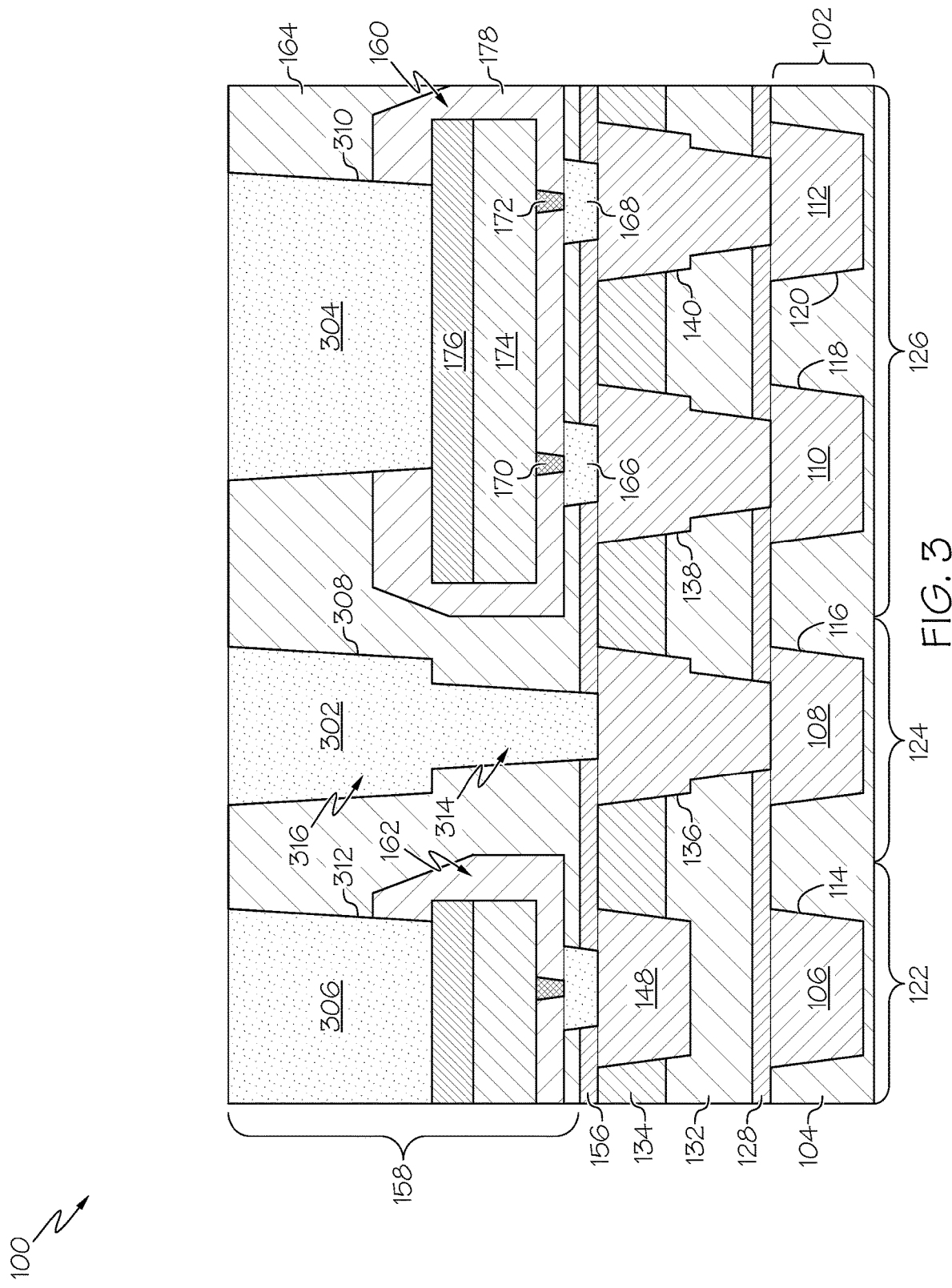
FIG. 3 is a cross-sectional view of the semiconductor device structure after a metal fill process has been performed to fill the interconnect cavity and the electrode contact cavity with a first metal according to one embodiment of the present invention.

FIGS. 2 and 3 show that after the one or more memory devices 160, 162 have been formed, one or more logic elements 302 and one or more top electrode contacts 304, 306 for the memory devices 160, 162 are formed. In one embodiment, electronic features/components such as interconnect structures (e.g., metal wires and vias), capacitors, transistors, etc. that are not part of the memory device/element may be referred to as "logic elements". In the illustrated example, logic element 302 is an interconnect structure comprising a via and metal layer/wire. In one embodiment, the interconnect structure 302 and top electrode contacts 304, 306 are formed using a dual damascene process where vias are first patterned then both vias and trenches are patterned. However, other processes for forming these features are applicable as well.

For example, in one embodiment, a patterning stack is formed on and in contact with insulating layer 164. The stack may comprise multiple hard mask layers such as sacrificial nitride, titanium nitride, oxide, and/or the like. The stack may also comprise a tri-layer or quad layer lithography stacks. For example, the stack may comprise an organic planarization layer (OPL), an anti-reflective coating (ARC) layer, and a photoresist layer. The OPL may include a material(s) such as spin-on carbon (SOC), diamond-like carbon, polyarylene ether, polyimide, polymethyl methacrylate, polymethylisopropenyl ketone, photoresists, and/or the like. The OPL may be formed utilizing any conventional deposition process including, for example, CVD, PVD, plasma enhanced chemical vapor deposition (PECVD), evaporation, spin coating, and dip coating. Chemical mechanical planarization (CMP) and/or grinding may be used to planarize the deposited OPL. The ARC layer may comprise a silicon-ARC, titanium-ARC, and/or the like. The ARC layer may be formed by, for example, one or more processes including sputtering, evaporation, CVD, PVD, ALD, and/or the like. The photoresist layer may comprise a material that is sensitive to one or more types of patterning processes such extreme ultraviolet (EUV) light patterning and/or the like. The photoresist layer may be deposited using one or more processes such as CVD, PVD, ALD, and/or the like.

The photoresist layer may be patterned using any suitable photolithography technique. For example, in one embodiment, a photomask is disposed over the photoresist layer. The photoresist layer may then be exposed to a radiation beam, and then hardened via a curing or baking process. Unexposed or exposed portions of the photoresist layer may then be removed using a developer. The foregoing process results in the desired pattern. The pattern includes portions of the photoresist layer in contact with ARC layer while other portions of the ARC layer remain exposed. In some embodiments, the portions of the photoresist layer may be trimmed using, for example, an anisotropic plasma etch process.

After the photoresist layer has been patterned, the pattern is transferred down through the underlying layers of the structure to form a via portion 202 of the interconnect structure 302 in the logic area 124. In the example shown in FIG. 2, the pattern is transferred down through the insulating layer 164 and cap layer 156 to expose a portion of top surface of the logic area Mx+1 metal layer 150. A similar patterning process may then be performed to form one or more trenches 204 to 208. At least one trench 204 is formed above the via portion 202 for the interconnect structure 302 and one or more additional trenches 206, 208 are formed above the memory devices 160, 162. In one embodiment, the memory device trench 206, 208 is formed through the insulating layer 164 and hard mask 178 of the memory device 160, 162 and exposes at least a portion of the top surface of the top electrode 176.

A metal fill process is then performed to fill the via(s) 202 and trenches 204 to 208. However, in some embodiments, a barrier liner 308 to 312 may be formed within the via 202 and trenches 206, 208 prior to the metal fill process. The metal fill process forms the top electrode contacts 304, 306, and further forms a Vx+1 metal layer 314 and an Mx+2 metal layer 316 for the logic area interconnect structure 302. The top electrode contacts 304, 306 may also be referred to as Mx+2 metal layers as well. Any remaining patterning material and excess metal fill may be removed by, for example CMP. The metal may be planarized such that the top surface of the interconnect structure 302 and top electrode contacts 304, 306 are co-planar with the top surface of the insulating layer 164.

In one or more embodiments, metal fill materials such as tungsten, CVD cobalt, CVD ruthenium, and/or the like are utilized to form the interconnect structure 302 and electrode contacts 304, 306. These metals, in one embodiment, are selected due to their insulating characteristics, which protect copper interconnect levels in the memory area 126 from the heat generated by the memory device 160, 162. However, the logic area interconnect structure(s) 302 is also filled with the same metal since the interconnect structure 302 and the memory electrode contacts 304, 306 are formed at the same time. Using a metal such as tungsten for the interconnect structure 302 within the device layer 158 is problematic since the deposition method (e.g., CVD) usually forms a seam in the metal layer that causes high wire resistance and issues for properly landing subsequently formed vias on the interconnect structure 302. In addition, resistance-capacitance (RC) performance may be reduced and overall yield may be degraded.

Figure 4:
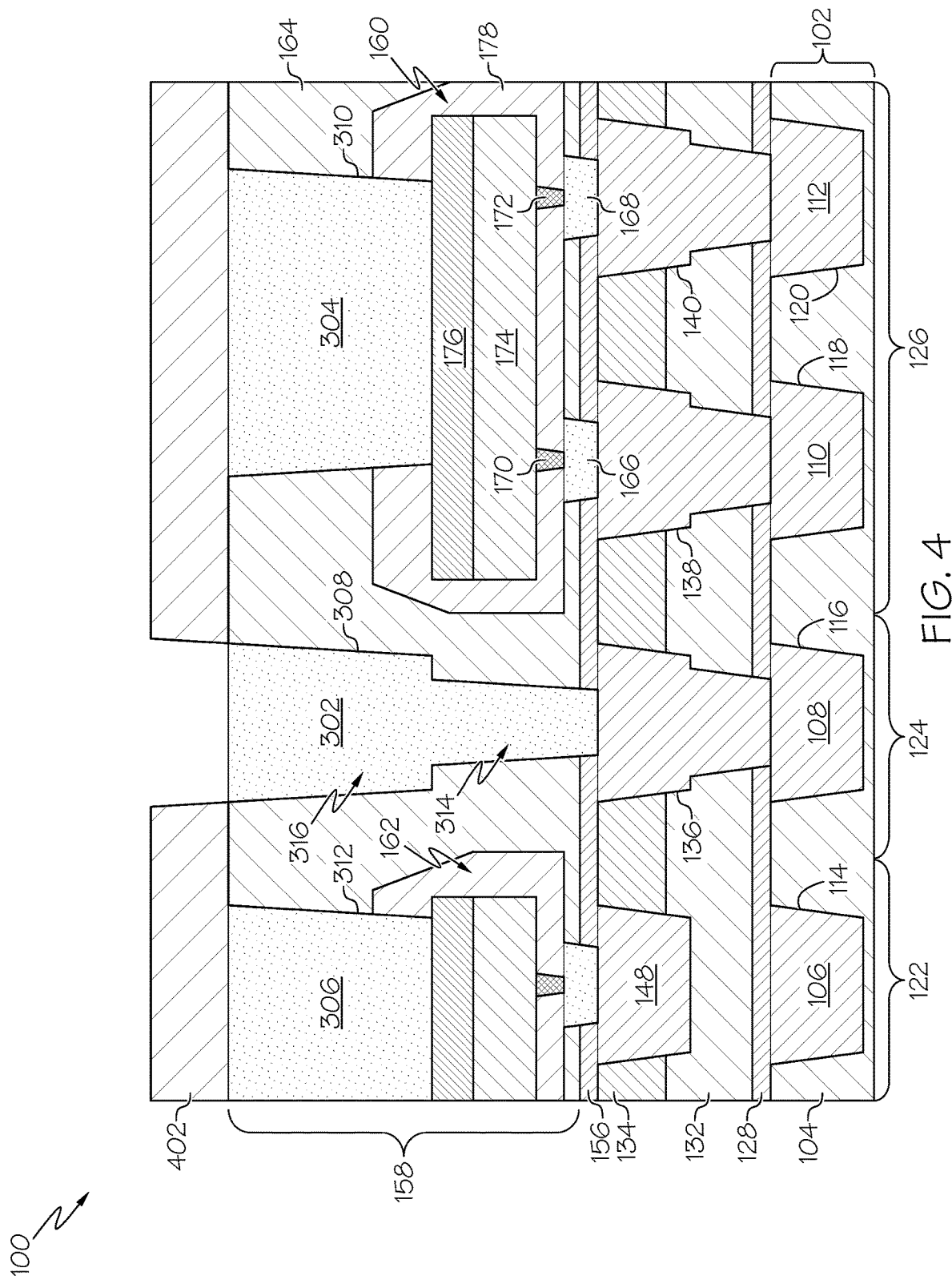
FIG. 4 is a cross-sectional view of the semiconductor device structure after a patterning mask has been formed over the memory device area while leaving the interconnect cavity exposed according to one embodiment of the present invention.
Figure 5:
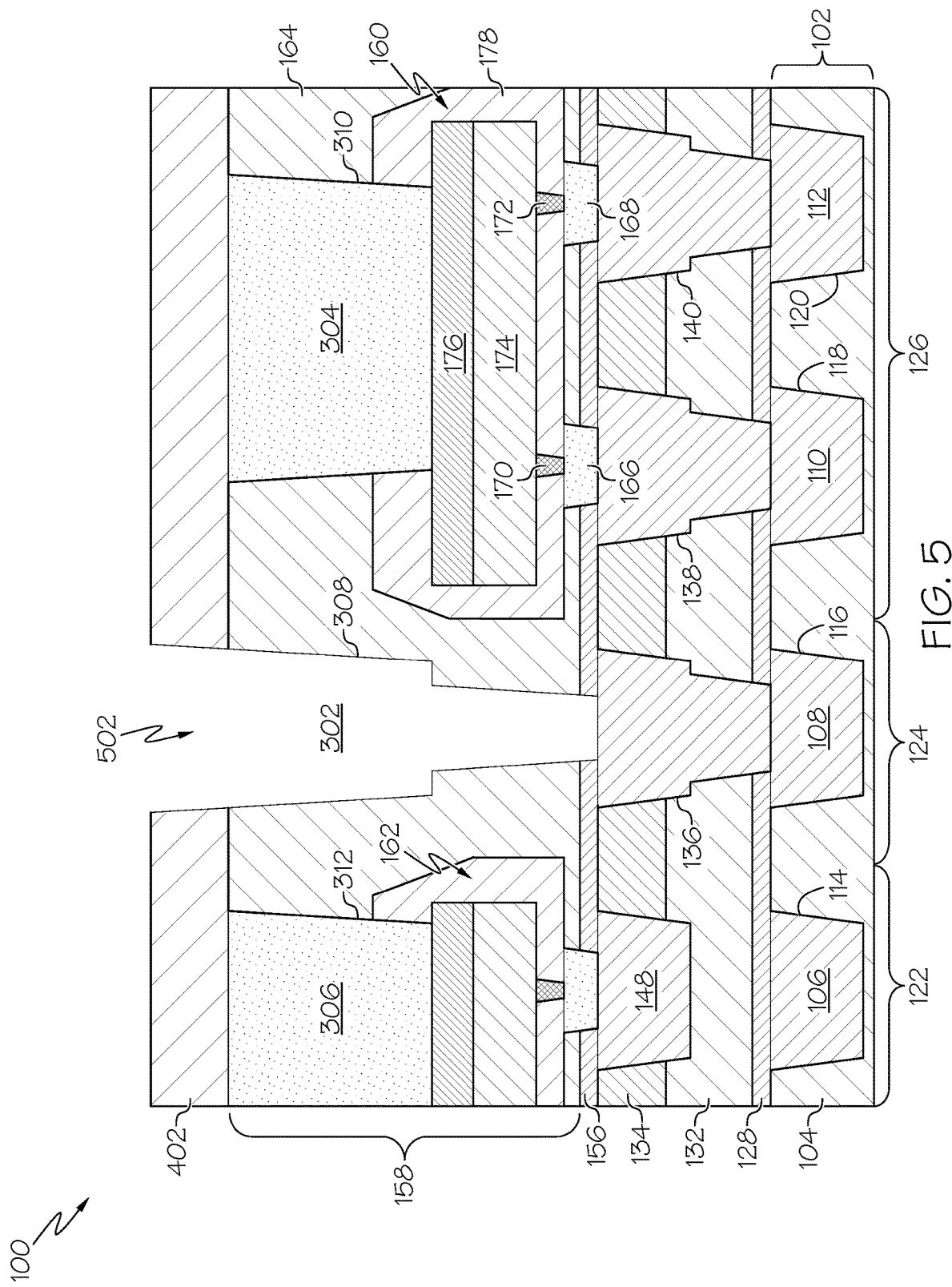
FIG. 5 is a cross-sectional view of the semiconductor device structure after the first metal has been selectively removed from the interconnect structure cavity according to one embodiment of the present invention.

Therefore, one or more embodiments, remove the tungsten from the logic area 124 and fill the resulting cavity with another metal such as copper that avoids the above issues caused by tungsten. For example, FIG. 4 shows that one or more mask layers 402 have been patterned to form an opening 404 exposing the underlying interconnect structure 302 while covering the underlying top electrode contacts 304, 306. The mask layer 402 may comprise be an OPL and may be deposited by an applicable deposition method such as those discussed above with respect to FIG. 2. A selective process such as (but not limited to) an EDP "T" etch is performed to remove the metal from the interconnect structure 302 selective to the surrounding layers. EDP is an aqueous solution of ethylene diamine and pyrocatechol. FIG. 5 shows that this etching process forms a cavity 502 where the previous interconnect metal was situated.

Figure 6:
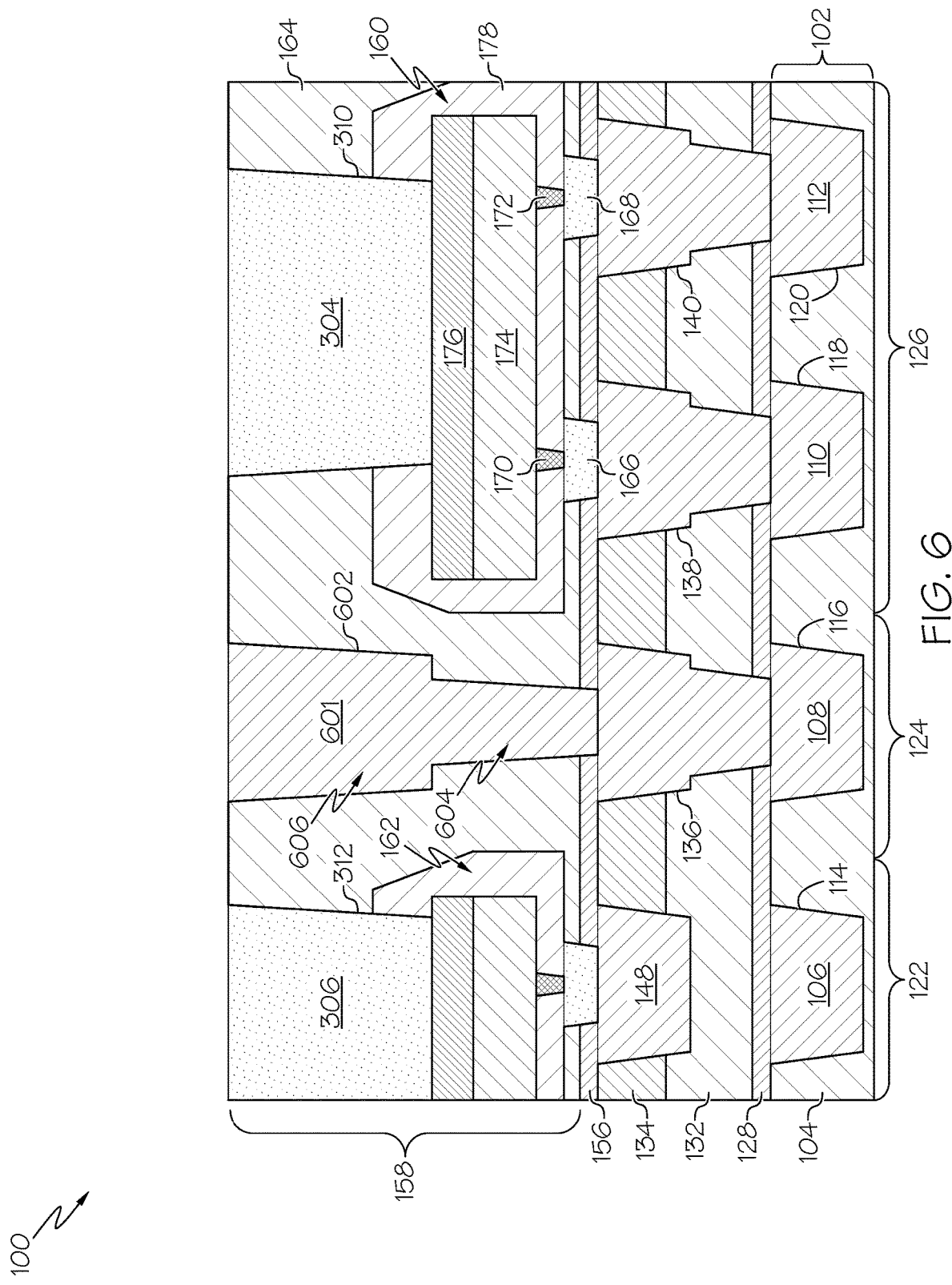
FIG. 6 is a cross-sectional view of the semiconductor device structure after another metal fill process has been performed to fill the interconnect structure cavity with a second metal that is different than the first metal according to one embodiment of the present invention.

FIG. 6 shows that after the tungsten has been removed from the interconnect structure 302, a diffusion barrier liner 602 may be formed within the cavity 502 using, for example, CVD or ALD. A metallization process is then performed to form/deposit copper (or similar metal) within the cavity 502. Various metallization process may be utilized. For example, a copper seed can be deposited via PVD followed by copper plating. A reflow process may also be utilized. An optional anneal may also be performed to condense the contact/interconnect material, depending on the requirement for final layer quality, thermal budget, and throughput. The metal may then be planarized down to the insulating layer 164. The above processes result in a new interconnect structure 601 comprising a copper Vx+1 layer 604 and a copper Mx+2 layer 606, whereas the top electrode contacts 304, 306 maintain their original metal layers (e.g., tungsten).

Figure 7:
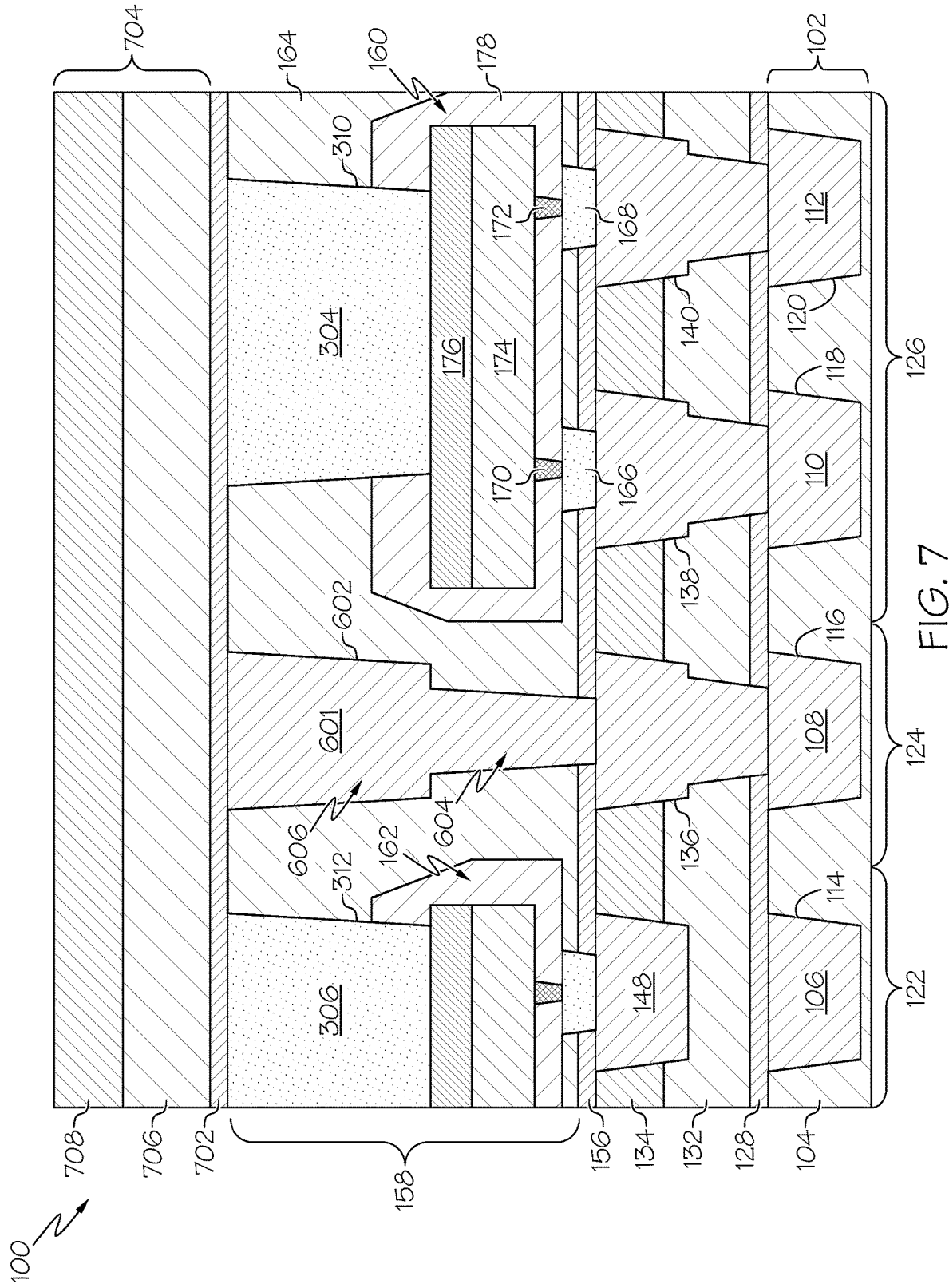
FIG. 7 is a cross-sectional view of the semiconductor device structure after an additional interlayer dielectric layer has been formed above the memory device comprising the first metal and the interconnect structure comprising the second metal according to one embodiment of the present invention.
Figure 8:
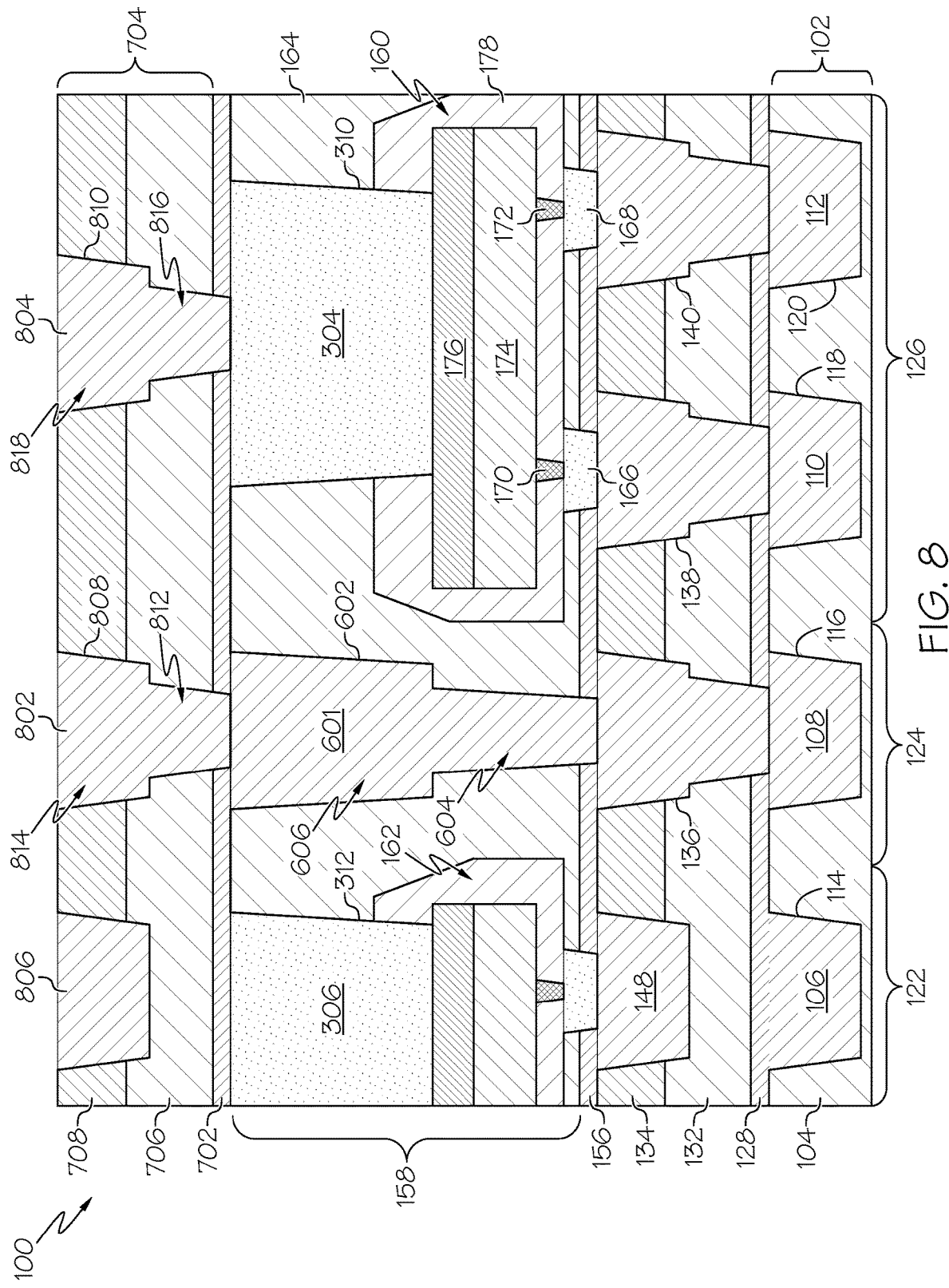
FIG. 8 is a cross-sectional view of the semiconductor device structure after additional metal layers and vias have been formed in the additional interlayer dielectric layer according to one embodiment of the present invention.

FIGS. 7 and 8 show that after the new metal has been deposited into the interconnect structure cavity 502 additional metallization layers may be formed. In one embodiment, one or more cap layers 702 are first formed on and in contact with the top surfaces of the interconnect structure 601 and top electrode contacts 304, 306 as shown in FIG. 7. The cap layer 702, in one embodiment, may be a dielectric layer comprising materials such as silicon carbonitride (SiCN:H), silicon carbide, hydrogen and nitrogen doped silicon carbide, silicon nitride, and/or the like.

A third metallization stack 704 is then formed on top of the cap layer 702 and above the device layer 158. The third metallization stack, in one embodiment, is an ILD layer comprising one or more layers such as a first insulating layer 706 disposed on and in contact with the cap layer 702 and a second insulating layer 708 disposed on and in contact with the first insulating layer 706. It should be noted that one or more additional layers may be formed below the first insulating layer 706; between the first and second insulating layers 706, 708; and/or above the second insulating layer 708. The first insulating layer 706 may comprise an insulating material such as tetraethyl orthosilicate (TEOS), an oxide; a moderate-k, low-k, or ultra-low-k dielectric; and/or the like. The second insulating layer 708 may comprise an insulating material such as fluorine-doped tetraethyl orthosilicate (FTEOS), an oxide; a moderate-k, low-k, or ultra-low-k dielectric; and/or the like.

One or more interconnect structures 802, 804 are then formed within the third metallization stack 704 as shown in FIG. 8. For example, a dual damascene process may be utilized similar to that discussed above with respect to FIGS. 2 and 3. Similar structures 806 may be formed in the peripheral area 122 as well. In one embodiment, a patterning stack is formed on and in contact with the second insulating layer 708. The stack may comprise multiple hardmask layers such as sacrificial nitride, titanium nitride, oxide, and/or the like. The stack may also comprise a tri-layer or quad layer lithography stacks. One or more etching processes are then performed to form vias and trenches for the interconnect structures 802, 804. The etching process etches through the cap layer 702 and the insulating layers 706, 708 of the third metallization stack 704 thereby exposing the top surface of the layer interconnect structure 601 within the device layer 158 and the top surface of the top electrode contact 304 in at least the memory device area 126.

In one embodiment, a diffusion barrier liner 808, 810 is formed within the vias and trenches using, for example, CVD or ALD process. A metal fill process may then be performed to fill the vias and trenches to form the interconnect structures 802, 804. For example, a copper seed may be deposited via PVD followed by copper plating, although chemical vapor deposition (CVD) techniques could be used as well. However, other materials and processes may be utilized fill the vias and trenches. The metal may be planarized such that the top surface of the interconnects 802, 804 are planar with the top surface of the second insulating layer 708.

The metallization stack interconnect structure 802 within the logic area 124, in this example, comprises a Vx+2 metal layer 812 and an Mx+3 metal layer 814. The Vx+2 metal layer 814 is in contact with the Mx+2 metal layer 606 of the underlying device layer interconnect structure 601. Interconnect structure 601 connects the Mx+1 metal layer 108 within the logic area 124 to the Mx+3 metal layer 814 of the interconnect structure 802 in the third metallization stack 704. Since the tungsten was removed from the device layer interconnect structure 601 and replaced with copper, problems caused by the Vx+2 metal layer 820 landing on a tungsten seam/void are avoided. The metallization stack interconnect structure 804 within the memory area 126, in this example, comprises a Vx+1 metal layer 816 and an Mx+3 metal layer 818. The Vx+1 metal layer 816 in the memory area 126 is in contact with the top surface of the top electrode contact 304 in the device layer 158.

Figure 9:
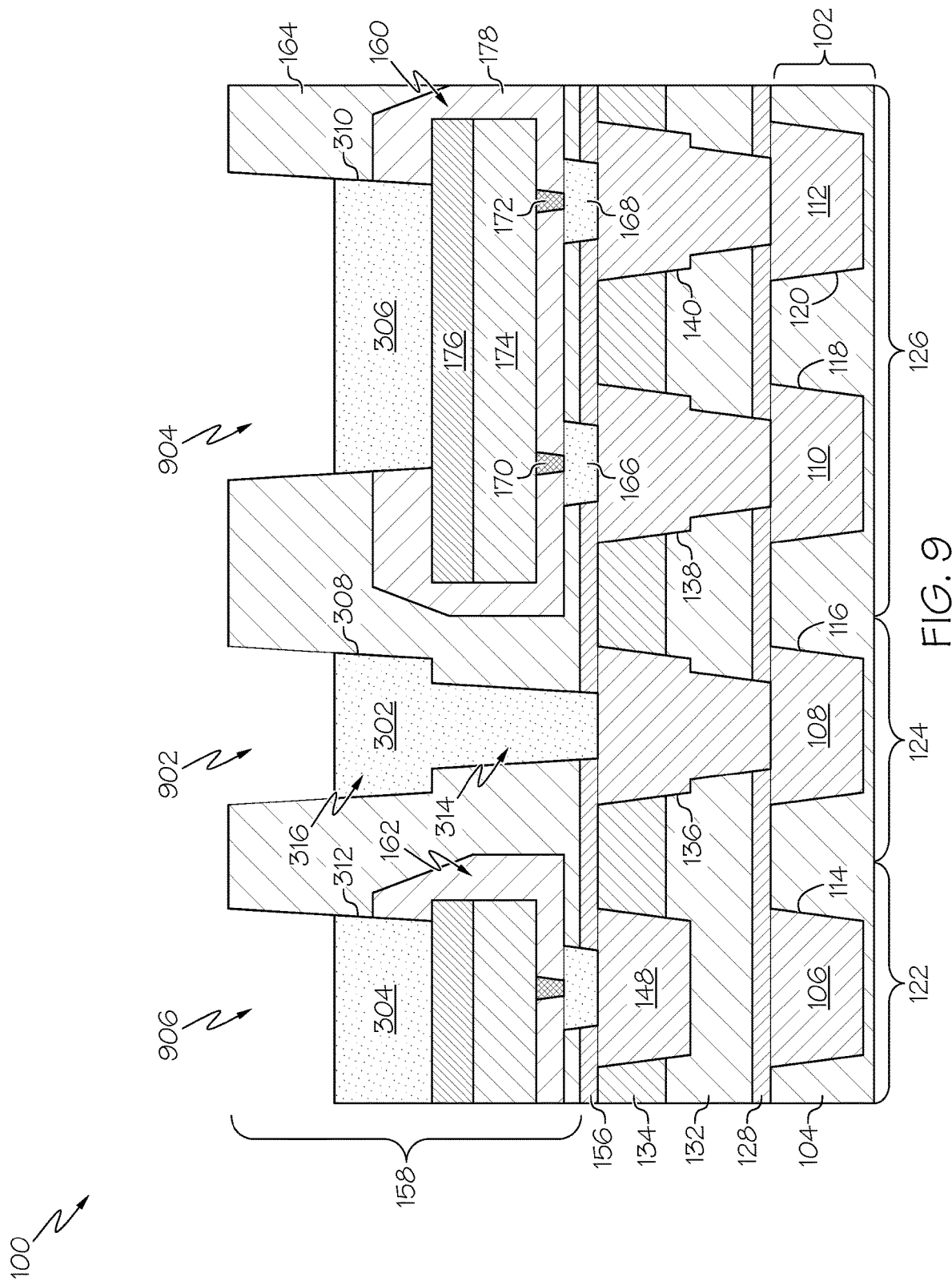
FIG. 9 is a cross-sectional view of the semiconductor device structure illustrated in FIG. 3 after the first metal has been partially recessed in in the electrode contact cavity and the interconnect structure cavity according to another embodiment of the present invention.
Figure 10:
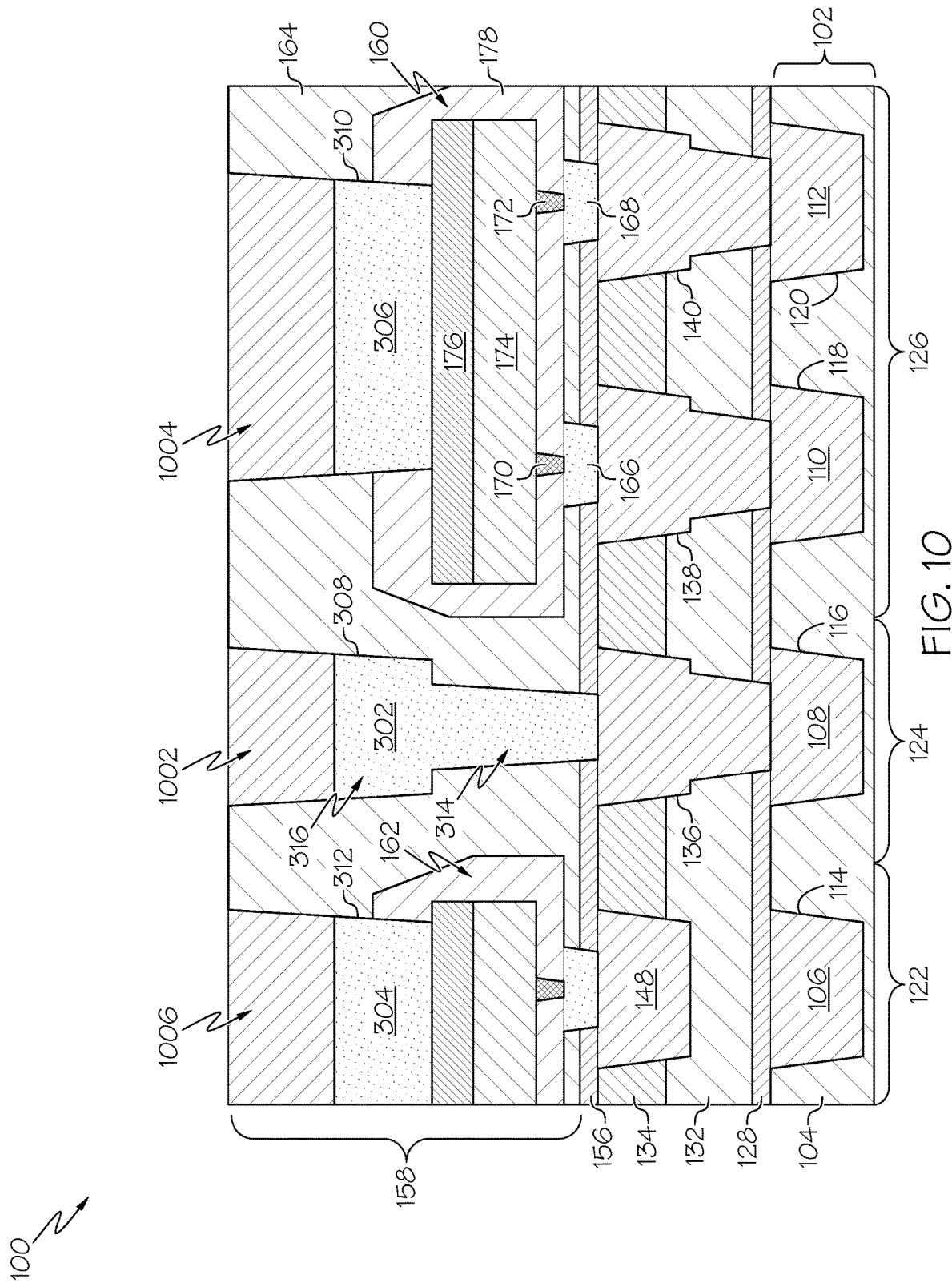
FIG. 10 is a cross-sectional view of the semiconductor device structure after a second metal has been formed on top of and in contact with the recessed first metal in the electrode contact cavity and the interconnect structure cavity according to another embodiment of the present invention.
Figure 11:
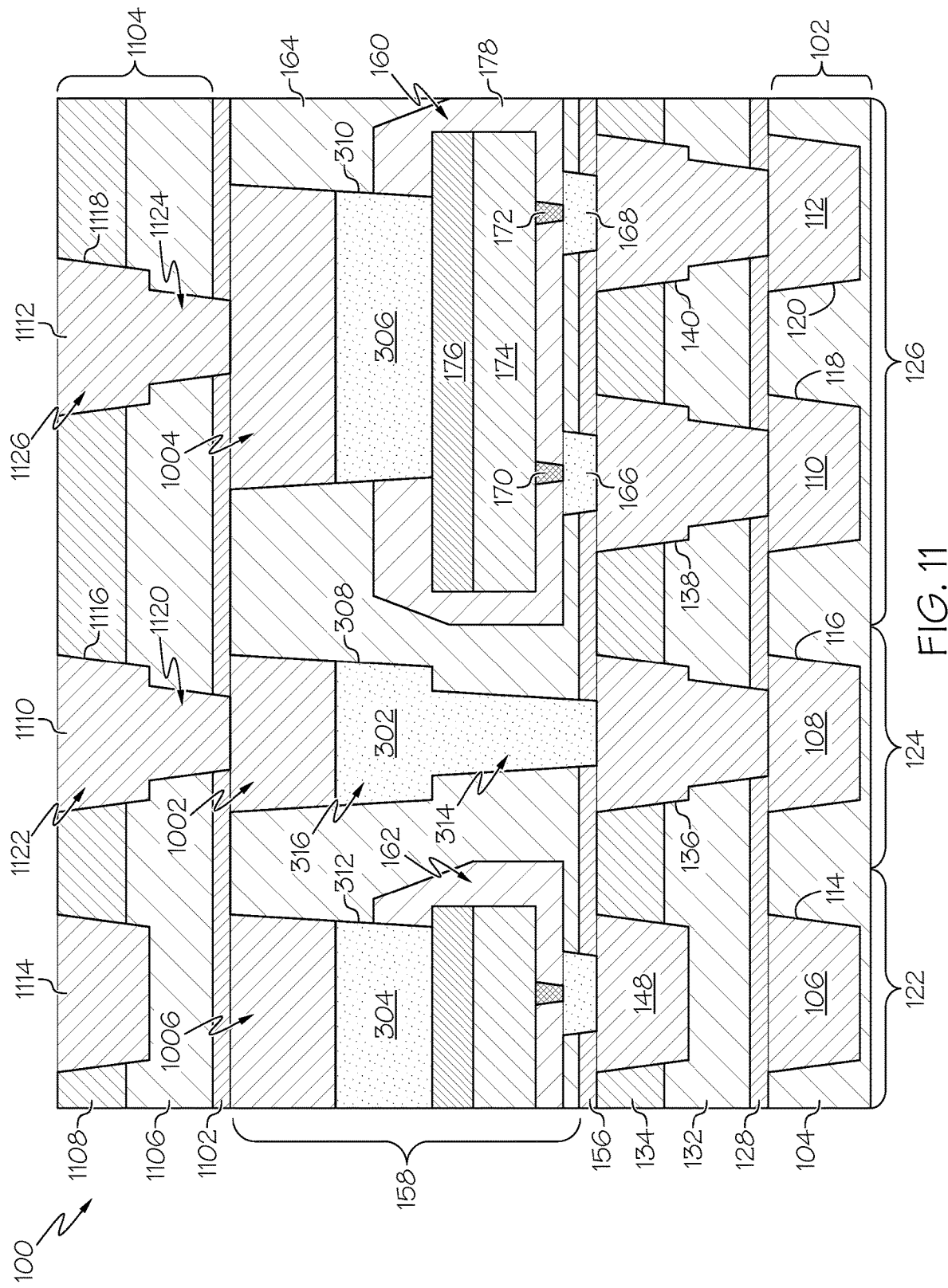
FIG. 11 is a cross-sectional view of the semiconductor device structure after additional metal layers and vias have been formed in an additional interlayer dielectric layer according to one embodiment of the present invention.

FIGS. 9-11 are directed to an additional embodiment where the metal (e.g., tungsten) deposited to form the interconnect structure 302 and top electrode contacts 304, 306 is partially removed and replaced by another metal such as copper to form bi-layer metal layers. For example, FIG. 9 shows the structure 100 after the processes discussed above with respect to FIGS. 1-3 have been performed and interconnect structure 302 and top electrode contacts 304, 306 have been partially recessed. In one embodiment, the interconnect structure 302 and top electrodes 304, 306 are partially recessed using a selective etching process such as RIE. The current metal (e.g., tungsten) of the interconnect structure 302 and top electrode contacts 304, 306 is partially etched down to form a cavity 902 to 906 within the insulating layer 164 above the remaining portion of the metal. In some embodiments, the resulting thickness of the etched interconnect structure 302 and the top electrode contacts 304 is ⅓ to ½ of the total thickness of the tungsten. However, other thicknesses are applicable as well. Portions of the diffusion liners 308 to 312 corresponding to the etched portions of the metal may also be etched away as well.

FIG. 10 shows that after the current metal (e.g., tungsten) of the interconnect structure 302 and top electrode contacts 304, 306 is partially etched down, a metal fill process is performed to fill the cavities with a second metal 1002 to 1006 (e.g., copper, cobalt, ruthenium, etc.) on and in contact with the first metal. In one embodiment, the first metal is different than the second metal. Various metal fill processes may be utilized. For example, a copper seed can be deposited via PVD followed by copper plating. A reflow process may also be utilized. An optional anneal may also be performed to condense the contact/interconnect material, depending on the requirement for final layer quality, thermal budget, and throughput. The metal may then be polished/planarized down to the insulating layer 164. In some embodiments, a barrier liner may first be deposited in the cavities for the second metal 1002 to 1006.

The above processes results in a bi-metal layer 316 for interconnect structure 302 and the top electrode contacts 304, 306. For example, FIG. 10 shows that a bottom portion of the interconnect structure metal layer 316 and a bottom portion of the top electrode contacts 304, 306 comprises a metal such as tungsten while a top portion of the interconnect structure metal layer 316 and a top portion of the top electrode contacts 304, 306 comprises a metal such as copper. Additional fabrication processes may then be performed to form one or more metallization layers above the device layer 158 similar to that discussed above with respect to FIGS. 7 and 8.

For example, FIG. 11 shows that one or more cap layers 1102 are first formed on and in contact with the top surfaces of the interconnect structure 302 and top electrode contacts 304, 306. A third metallization stack 1104 is then formed on top of the cap layer 1102 and above the device layer 158. The third metallization stack, in one embodiment, is an ILD layer comprising one or more layers such as a first insulating layer 1106 disposed on and in contact with the cap layer 1102 and a second insulating layer 1108 disposed on and in contact with the first insulating layer 1106.

One or more interconnect structures 1110, 1112 are then formed within the third metallization stack 1104. For example, a dual damascene process may be utilized similar to that discussed above with respect to FIGS. 2 and 3. Similar structures 1114 may be formed in the peripheral area 122 as well. In one embodiment, a diffusion barrier liner 1116, 1118 is formed within the vias and trenches using, for example, CVD or ALD process. A metal fill process may then be performed to fill the vias and trenches to form the interconnect structures 1110, 1112. The metal may be planarized such that the top surface of the interconnects 1110, 1112 are planar with the top surface of the second insulating layer 1108.

The interconnect structure 1110 within the logic area 124, in this example, comprises a Vx+2 metal layer 1120 and an Mx+3 metal layer 1122. The Vx+2 metal layer 1120 is in contact with the copper portion 1002 of the Mx+2 metal layer 316 of the underlying layer interconnect structure 302 in the device layer 158. Interconnect structure 302 connects the Mx+1 metal layer 108 within the logic area 124 to the Mx+3 metal layer 1122 of the interconnect structure 1110 in the third metallization stack 1104. The metallization stack interconnect structure 1112 within the memory area 124, in this example, comprises a Vx+1 metal layer 1124 and an Mx+3 metal layer 1126. The Vx+1 metal layer 1124 in the memory area 126 is in contact with the copper portion 1004 of the top electrode contact 304 in the device layer 158.

Figure 12:
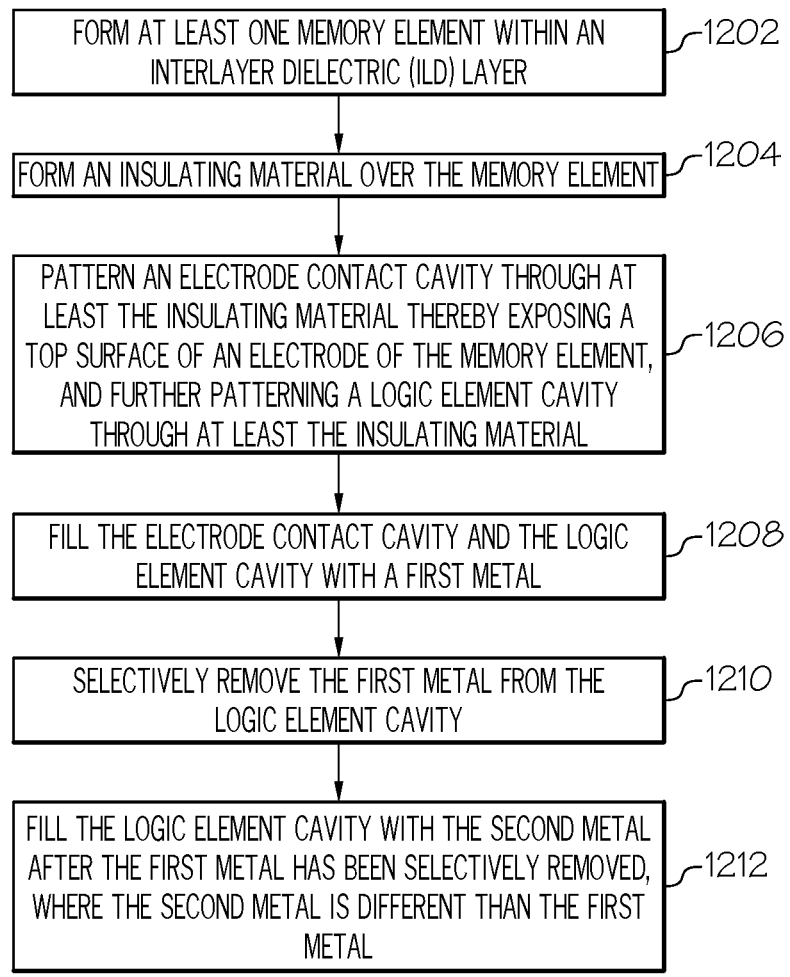
FIG. 12 is an operational flow diagram illustrating one example of a process for forming a semiconductor device structure comprising multi-metal interconnects according to one embodiment of the present invention.

FIG. 12 is an operational flow diagram illustrating one example of a process for forming a semiconductor device structure comprising multi-metal interconnects according to one embodiment of the present invention. It should be noted that each of the steps shown in FIG. 12 has been discussed in greater detail above with respect to FIGS. 1 to 8. At least one memory element within an interlayer dielectric (ILD) layer at step 1202. An insulating material is formed over the memory element at step 1204. An electrode contact cavity is patterned through at least the insulating material thereby exposing a top surface of an electrode of the memory element, and a logic element cavity is patterned through at least the insulating material at step 1206. The electrode contact cavity and the logic element cavity are filled with a first metal at step 1208. In one embodiment, the first metal is a chemical vapor deposited metal. The first metal is selectively removed from the logic element cavity at step 1210. The logic element cavity is filled with the second metal after the first metal has been selectively removed at step 1212. The second metal is different than the first metal.

Figure 13:
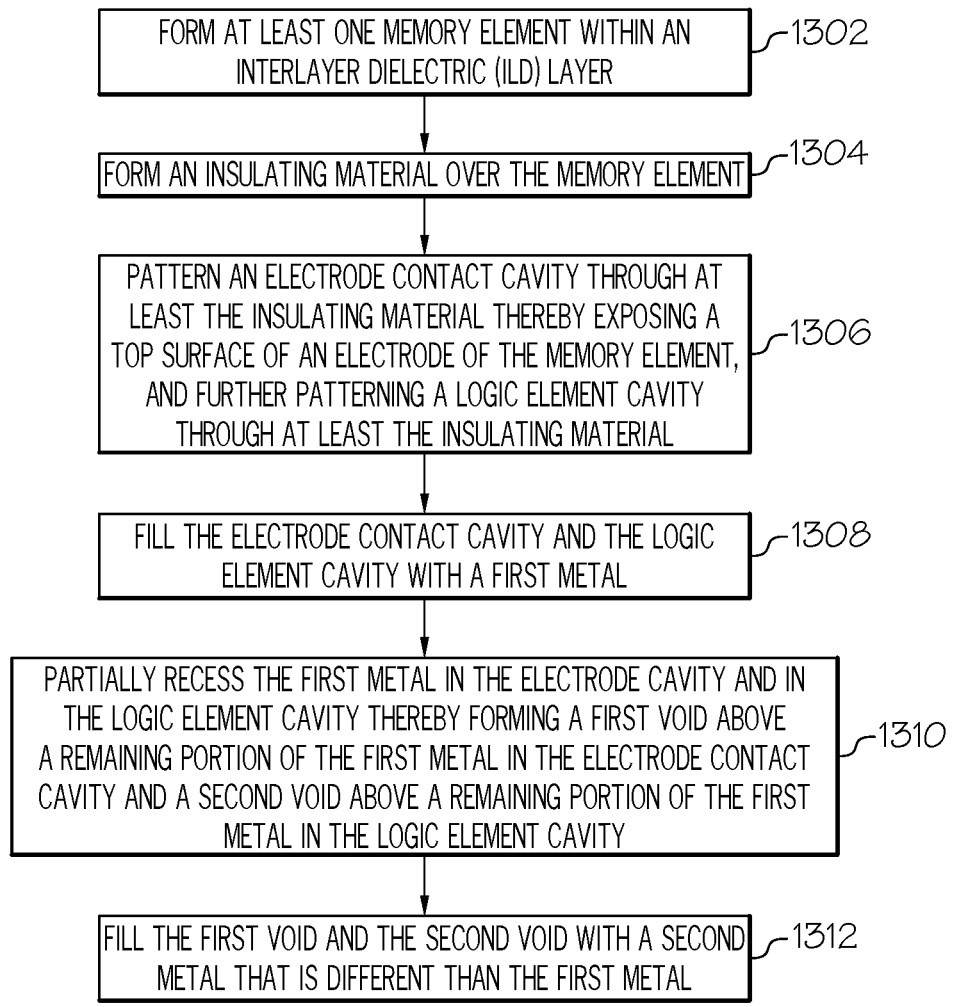
FIG. 13 is an operational flow diagram illustrating one example of a process for forming a semiconductor device structure comprising bi-layer metal interconnects according to one embodiment of the present invention.

FIG. 13 is an operational flow diagram illustrating one example of a process for forming a semiconductor device structure comprising multi-metal interconnects according to one embodiment of the present invention. It should be noted that each of the steps shown in FIG. 13 has been discussed in greater detail above with respect to FIGS. 1 to 3 and 9-11. At least one memory element within an interlayer dielectric (ILD) layer at step 1302. An insulating material is formed over the memory element at step 1304. An electrode contact cavity is patterned through at least the insulating material thereby exposing a top surface of an electrode of the memory element, and a logic element cavity is patterned through at least the insulating material at step 1306.

The electrode contact cavity and the logic element cavity are filled with a first metal at step 1308. In one embodiment, the first metal is a chemical vapor deposited metal. The first metal in the electrode cavity and in the logic element cavity is partially recessed thereby forming a first void above a remaining portion of the first metal in the electrode contact cavity and a second void above a remaining portion of the first metal in the logic element cavity at step 1310. The first void and the second void are filled with a second metal that is different than the first metal at step 1312.

Although specific embodiments of the invention have been taught, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed embodiments. Moreover, some statements may apply to some inventive features but not to others.

What is claimed is:

1. A semiconductor device structure comprising:
    an interlayer dielectric (ILD) comprised of a single layer disposed on and in physical contact with a cap layer;
    a memory element comprising an electrode disposed partially in the single layer of the ILD and partially in the cap layer, wherein each remaining component of the memory element is disposed entirely within the single layer of the ILD;
    an electrode contact disposed within an upper portion of the single layer of the ILD and having a bottom surface in physical contact with the memory element, the electrode contact comprising a first metal; and
    a logic element disposed within the single layer of the ILD and co-planar with memory element, the logic element comprising an Mx layer portion situated in the upper portion of the single layer of the ILD adjacent to the electrode contact and further comprising a Vx layer portion situated under and in-physical with the Mx layer portion, wherein the Mx layer portion and the Vx layer portion of the logic element comprise a second metal that is different than the first metal, and wherein a bottom-most surface of the Vx layer portion is co-planar with a bottom-most surface of the electrode of the memory element.

2. The semiconductor device structure of claim 1, wherein the first metal is a chemical vapor deposited metal and the second metal comprises one of copper, cobalt, or ruthenium.

3. The semiconductor device structure of claim 1, wherein the logic element is an interconnect structure comprising a metal layer and a via layer each comprising the second metal, and wherein the metal layer is the Mx layer portion and the via layer is the Vx layer portion.

4. The semiconductor device structure of claim 1, wherein the logic element couples at least one metal layer disposed above the logic element to at least one metal layer disposed below the logic element.

5. The semiconductor device structure of claim 1, further comprising:
    a lower ILD layer disposed below the single layer of the ILD and comprising at least a first metal layer coupled to the memory element and at least a second metal layer coupled to the logic element; and
    an upper ILD layer disposed above the single layer of the ILD and comprising at least a third metal layer coupled to the electrode contact and at least a fourth metal layer coupled to the logic element.

6. The semiconductor device structure of claim 5, wherein at least the third and fourth metal layers comprise the second metal.

7. The semiconductor device structure of claim 1, wherein the memory element is one of a phase-change memory element or a magneto-resistive memory element.

8. The semiconductor device structure of claim 1, further comprising a hard mask surrounding the memory element and a portion of the electrode contact, wherein the electrode is in contact with a bottom-most surface of the hard mask.

9. A semiconductor device structure comprising:
    an interlayer dielectric (ILD) comprised of a single layer disposed on and in physical contact with a cap layer;
    a memory element comprising a first electrode disposed partially in the single layer of the ILD and partially in the cap layer, wherein each remaining component of the memory element is disposed entirely within the single layer of the ILD;
    an electrode contact disposed entirely within the single layer of the ILD and comprising a first portion having a first metal in contact with a second electrode of the memory element, the electrode contact further comprising a second portion having a second metal disposed above and in physical contact with the first metal, wherein the first metal is different than the second metal; and a logic element disposed within the single layer of the ILD and comprising and Mx layer portion and a Vx layer portion situated under and in-physical with the Mx layer portion, the Mx layer portion having a top surface that is co-planar with a top surface of the electrode contact and the Vx layer portion having an upper portion that is co-planar with a top-most surface of the second electrode and a bottom-most surface that is co-planar with a bottom-most surface of the first electrode, the logic element further comprising the first metal and the second metal, wherein the second metal is disposed above and in contact with the first metal.

10. The semiconductor device structure of claim 9, wherein the first metal comprises tungsten and the second metal comprises one of copper, cobalt, or ruthenium.

11. The semiconductor device structure of claim 9, wherein the logic element couples at least one metal layer disposed above the logic element to at least one metal layer disposed below the logic element.

12. The semiconductor device structure of claim 9, further comprising:
   a lower ILD layer disposed below the single layer of the ILD and comprising at least a first metal layer coupled to the memory element and at least a second metal layer coupled to the logic element; and
   an upper ILD layer disposed above the single layer of the ILD and comprising at least a third metal layer coupled to the electrode contact and at least a fourth metal layer coupled to the logic element.

13. The semiconductor device structure of claim 12, wherein at least the third and fourth metal layers comprise the second metal.

14. The semiconductor device structure of claim 9, wherein the memory element is one of a phase-change memory element or a magneto-resistive memory element.

15. The semiconductor device structure of claim 9, wherein at least a portion of the logic element is situated adjacent to at least a portion of the electrode contact in the ILD.

16. The semiconductor device structure of claim 9, wherein the memory element further comprises a phase change material layer disposed between the first electrode and the second electrode.

17. The semiconductor device structure of claim 16, wherein the memory element further comprises one or more heater structures disposed between and in contact with the first electrode and the phase change material layer.

18. The semiconductor device structure of claim 17, further comprising a hard mask surrounding the second electrode, the phase change material layer, and the one or more heater structures, and a portion of the electrode contact, wherein the first electrode is in contact with a bottom-most surface of the hard mask.

* * * * *